United States Patent [19]
Dahl et al.

[11] Patent Number: 5,925,908
[45] Date of Patent: Jul. 20, 1999

[54] INTEGRATED CIRCUIT INCLUDING A NON-VOLATILE MEMORY DEVICE AND A SEMICONDUCTOR DEVICE

[75] Inventors: Phillip Warren Dahl, Mesa; Jitendra Jayantilal Makwana, Chandler; Zhixu Zhou, Tempe, all of Ariz.

[73] Assignee: Motorola, Inc., Schaumburg, Ill.

[21] Appl. No.: 08/903,085

[22] Filed: Jul. 30, 1997

[51] Int. Cl.⁶ .................................................. H01L 29/788
[52] U.S. Cl. .......................... 257/316; 257/314; 257/324; 257/637; 438/257
[58] Field of Search .................................... 257/314, 315, 257/316, 324, 637; 438/257

[56] References Cited

U.S. PATENT DOCUMENTS

| | | | |
|---|---|---|---|
| 5,408,115 | 4/1995 | Chang | 257/324 |
| 5,422,504 | 6/1995 | Chang et al. | 257/316 |
| 5,470,772 | 11/1995 | Woo | 437/43 |
| 5,474,947 | 12/1995 | Chang et al. | 437/43 |
| 5,494,838 | 2/1996 | Chang et al. | 437/43 |
| 5,585,293 | 12/1996 | Sharma et al. | 437/43 |
| 5,589,413 | 12/1996 | Sung et al. | 437/43 |
| 5,729,035 | 3/1998 | Anma | 257/324 |
| 5,780,891 | 7/1998 | Kauffman et al. | 257/316 |
| 5,783,471 | 7/1998 | Chu | 438/257 |
| 5,783,849 | 7/1998 | Kishi et al. | 257/315 |
| 5,793,081 | 8/1998 | Tomioka et al. | 257/319 |

*Primary Examiner*—Valencia Martin-Wallace
*Attorney, Agent, or Firm*—Kenneth M. Seddon

[57] ABSTRACT

An integrated circuit (10) is formed on a semiconductor substrate (20) and includes a non-volatile memory device (12) and a semiconductor device (11). The non-volatile memory device (12) includes a dielectric layer (15) than has a nitrogen composition. The non-volatile memory device (12) also includes a silicon dioxide layer (33) that is also used to form part of the semiconductor device (11).

13 Claims, 1 Drawing Sheet

INTEGRATED CIRCUIT INCLUDING A NON-VOLATILE MEMORY DEVICE AND A SEMICONDUCTOR DEVICE

BACKGROUND OF THE INVENTION

This invention relates, in general, to semiconductor devices, and more particularly, to non-volatile memory devices.

Electrically erasable and programmable read-only memory (EEPROM) devices are one form of non-volatile memory devices which are erased and programmed using electrical signals. Within an EEPROM device are a plurality of memory cells, each of which may be individually programmed and erased. In general, an EEPROM cell includes a floating gate transistor and a select transistor. The select transistors in an EEPROM device are used to select individual EEPROM cells which are to be erased or programmed. The floating gate transistors in the device are those transistors which actually store the digital value of each particular memory cell.

To program and erase a cell, a phenomenon known as Fowler-Nordheim tunneling is commonly used to store either a positive or a negative charge on a floating gate electrode of the floating gate transistor. For example, programming is accomplished by applying a positive voltage to a drain and a gate of the select gate transistor while a control gate of the floating gate transistor is held at ground. As a result, electrons tunnel from the floating gate of the floating gate transistor through a tunnel dielectric to the drain, leaving the floating gate positively charged.

One limitation of conventional EEPROM devices is their inability to operate reliably under extreme temperature conditions. For example, in applications involving automotive or industrial conditions, EEPROM devices can be exposed to temperatures in excess of 135° Celsius (C) or as low as −40° C. Under these extreme temperatures conditions, both the data retention and the write/erase cycling (endurance) of the EEPROM device are severely degraded. This is due in part to the characteristics of the materials used to form the dielectric structures within the EEPROM device.

Accordingly, it would be advantageous to provide a non-volatile memory device that can operate under elevated temperatures and still maintain desirable endurance and data retention characteristics.

Figure 1:
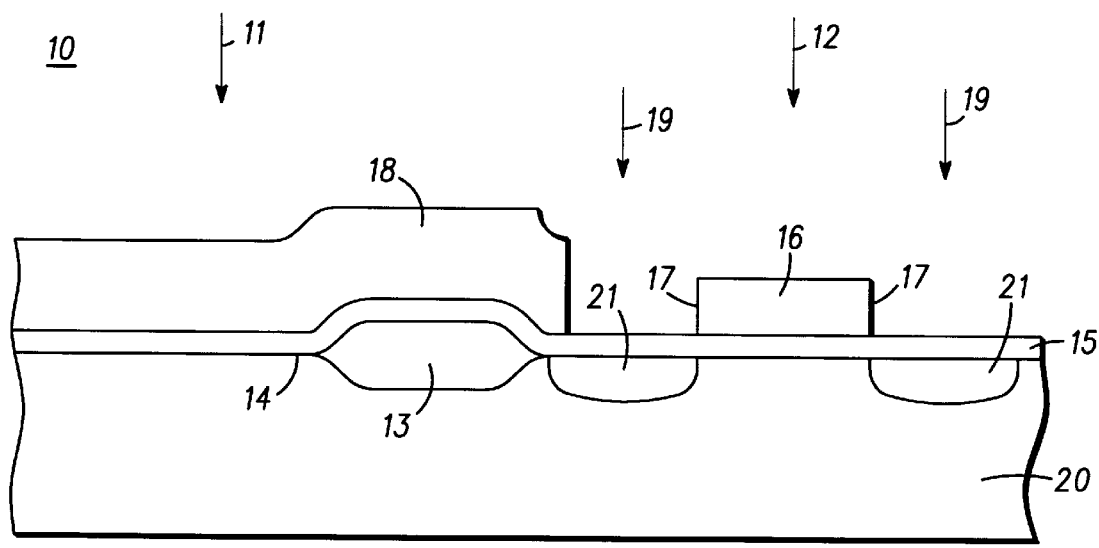
FIGS. 1–2 are enlarged cross-sectional views of an integrated circuit at various stage of manufacture in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of an integrated circuit 10 at an early stage of manufacture in accordance with the present invention. More particularly, FIG. 1 illustrates the portion of integrated circuit 10 where a non-volatile memory device 12 and a field effect transistor (FET) or semiconductor device 11 are to be formed. It should be understood that the teachings of the present invention can have application in a variety of structures and that integrated circuit 10 can be a microprocessor, a microcontroller, or the like.

Non-volatile memory device 12 could be one of a variety of semiconductor devices including an electrically programmable read only memory (EPROM), an electrically erasable and programmable read only memory (EEPROM), a flash electrically programmable read only memory (flash EPROM), a flash electrically erasable and programmable read only memory (flash EEPROM), or other type of memory storage device. Non-volatile memory device 12 is formed on a surface 14 of a semiconductor substrate 20 and is electrically isolated from semiconductor device 11 by an isolation structure 13 that is formed therebetween. In the example illustrated in FIG. 1, isolation structure 13 is a field oxidation structure formed by a localized oxidation of silicon (LOCOS) process. However, isolation structure 13 can be a trench structure and include the use of well regions (not shown) to provide the desired electrical isolation between non-volatile memory device 12 and semiconductor device 11.

A process of forming integrated circuit 10 in accordance with the present invention begins with the formation of a dielectric layer 15 across the surface 14 of semiconductor substrate 20. Dielectric layer 15 acts as a tunnel dielectric layer during the programming and erasing of non-volatile memory device 12. Therefore, dielectric layer 15 should to be thin enough to allow electrons to pass through it during programming conditions, yet thick enough to prevent the stored charge from leaking out of non-volatile memory device 12. Preferably, a thermal oxidation process is used to form a layer silicon dioxide to provide dielectric layer 15. It has been discovered that the tolerance of non-volatile memory device 12 to high operational temperatures can be improved by forming a layer of oxy-nitride to provide dielectric layer 15.

For example, the surface 14 of semiconductor substrate is exposed to an oxygen rich ambient at about 600° C. to 900° C. for about 30 minutes to 3 hours. During the formation of dielectric layer 15, a nitrogen source gas such as nitrous oxide ($N_2O$), ammonia ($NH_3$), or nitric oxide (NO) is introduced into the ambient in proper proportion so that dielectric layer 15 has a nitrogen composition ranging from about 3 percent to 10 percent by weight. The thickness of dielectric layer 15 can be varied to adjust the minimal operational voltage of non-volatile memory device 12, and preferably, the thickness of dielectric layer 15 ranges from about 35 angstroms (Å) to 300 Å. It should be understood that dielectric layer 15 can comprise a sequence of layers made of silicon dioxide and oxy-nitride and that dielectric layer 15 can be a pure layer of silicon dioxide if desired.

Following the formation of dielectric layer 15, a floating gate structure 16 is formed to provide a charge-storage structure for non-volatile memory device 12. Floating gate structure 16 is formed from a layer of conductive material (not shown) such as polysilicon or amorphous silicon that is deposited using a low pressure vapor deposition (LPCVD) process. The layer of conductive material is then patterned as shown in FIG. 1 using a conventional photolithographic mask and etch process. For example, a reactive ion etch (RIE) process is used to remove the exposed portions of the conductive layer and form floating gate structure 16 so that it has sidewalls 17. Preferably, floating gate structure 16 has a thickness ranging from about 1500 Å to 3500 Å.

An ion implantation mask 18 such as a layer of photoresist is formed and patterned over dielectric layer 15 to expose the portions of non-volatile memory device 12 where current carrying electrodes 21 are to be formed. Current carrying electrodes 21 are formed in semiconductor substrate 20 and act as the source and drain regions of non-volatile memory device 12. An ion implantation process (indicated in FIG. 1 with arrows 19) is then used to form current carrying electrodes 21. For example, an n-type dopant such as arsenic or phosphorus is implanted vertically into floating gate structure 16 and the exposed portions of dielectric layer 15 at an energy ranging from about 30 keV to 120 keV and a dose ranging from about $1 \times 10^{14}$ atoms/centimeter$^2$ (cm$^2$) to $5 \times 10^{15}$ atoms/cm$^2$. Preferably, the dopant is implanted perpendicularly to the surface 14 of semiconductor substrate 20, but an implant angle ranging from about 0° to 7° may also be desirable. It may also be desirable to form a pre-implant screen oxide (not shown) along the exposed top surface of floating gate structure 16. After the ion implantation process, ion implantation mask 18 is removed using conventional techniques known in the art.

Figure 2:
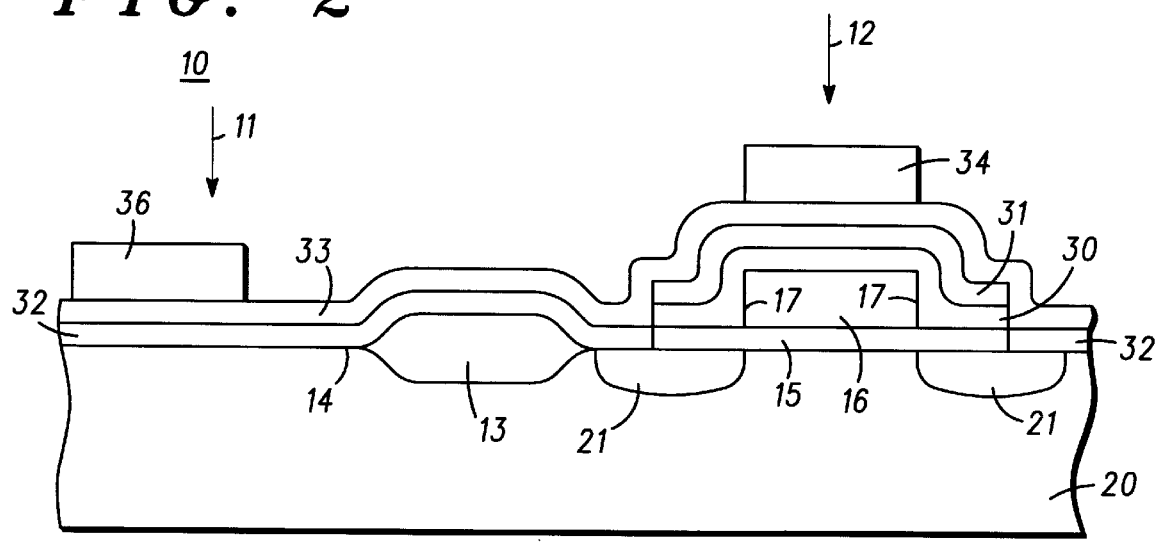

Referring now to FIG. 2, the process of forming non-volatile memory device 12 continues with the formation of dielectric material over floating gate structure 16 so that floating gate structure 16 can be electrically isolated from and capacitively couple to a control gate structure 34 formed subsequently. In the example provided below, two layers of material are formed over the entire surface 14 of semiconductor substrate 20 and then patterned by an etch process. A third layer of dielectric material is then formed over the remaining portions of the first two dielectric layers as well as over the region where semiconductor device 11 is formed. Therefore, the third dielectric layer is used to form part of both non-volatile memory device 12 and semiconductor device 11.

By preference, the formation of the dielectric material begins with the formation of a layer of silicon dioxide, hereinafter referred to as silicon dioxide layer 30, that is thermally grown on floating gate structure 16 and dielectric layer 15 by exposing semiconductor substrate 20 to an oxygen rich ambient at an elevated temperature. For example, semiconductor substrate 20 is placed into an LPCVD chamber at a temperature of about 600° C. to 900° C. for about 10 minutes to 2 hours. It is also possible to form silicon dioxide layer 30 using a process that involves the decomposition of tetraethylorthosilicate (TEOS) in an LPCVD process. Preferably, silicon dioxide layer 30 is about 50 Å to 250 Å thick.

A silicon nitride layer 31 is then formed over silicon dioxide layer 30 using a conventional LPCVD process. Silicon nitride layer 31 can have a thickness ranging from about 75 Å to 250 Å, and if desired, silicon nitride layer 31 can be formed such that a portion passes over the sidewalls 17 of floating gate structure 16 to protect floating gate structure 16 from subsequent processing. A photolithographic mask (not shown) and etch process are used to pattern silicon dioxide layer 30 and silicon nitride layer 31 such as is shown in FIG. 2. The etch process also removes dielectric layer 15 from the portion of semiconductor substrate 20 where semiconductor device 11 is to be formed.

A thermal oxidation process is then used to form a gate dielectric layer 32 on the exposed surface 14 of semiconductor substrate 20. As shown in FIG. 2, a portion of gate dielectric layer 32 is formed over isolation structure 13. However, it is well understood in the art that there may be no appreciable thickness of gate dielectric layer 32 where there already exists a significant amount of silicon dioxide such as over isolation structure 13. By preference, gate dielectric layer 32 has a thickness of about 30 Å to 250 Å.

Next, a silicon dioxide layer 33 is formed over gate dielectric layer 32 and silicon nitride layer 31 to provide a portion of the dielectric material for both non-volatile memory device 12 and semiconductor device 11. Silicon dioxide layer 33 is formed using an LPCVD process involving the decomposition of TEOS. For example, semiconductor substrate 20 is placed into an LPCVD reaction chamber at a temperature ranging from about 750° C. to 1100° C. for about 30 minutes to 2 hours while TEOS is introduced in to the LPCVD reaction chamber. Preferably, silicon dioxide layer 33 has a thickness of at least 40 Å, and more preferably, ranges from about 75 angstroms to 225 angstroms.

One distinction of the present invention over prior art structures is that conventional processes form silicon dioxide layers on silicon nitride layers using a thermal oxidation process. However, thermal oxidation of silicon nitride films is generally limited to forming silicon dioxide films that are less than 30 Å thick. In contrast, the present invention provides for the formation of silicon dioxide layer 33 so that it can have a thickness of 50 Å, 60 Å or even greater thickness.

Another distinction of the present invention is the quality of the silicon dioxide layer formed. Conventional thermal oxidation processes form a silicon dioxide layer that mimics the surface of the underlying silicon nitride layer. Thus, defects in the silicon nitride layer are replicated and stacking faults in the silicon dioxide layer are created. These stacking faults contribute to leakage current through the dielectric layer, which reduces the data retention capability of the device. In contrast, the present invention forms the upper silicon dioxide layer using an LPCVD deposition process which has fewer stacking faults, and thus, improved data retention capability.

Therefore, the present invention provides a non-volatile memory device that has a thicker and higher quality upper silicon dioxide layer. This in turn improves the data retention capability and endurance of non-volatile memory device 12 at elevated operational temperatures. It should also be noted that silicon dioxide layer 33 can be formed over the sidewalls 17 of floating gate structure 16, which protects non-volatile memory device 12 from subsequent processing.

Following the formation of silicon dioxide layer 33, a control gate structure 34 and a gate structure 36 are formed as part of non-volatile memory device 12 and semiconductor device 11, respectively. In the preferred embodiment, control gate structure 34 and gate structure 36 are formed from a single layer of polysilicon or amorphous silicon (not shown) that is deposited using conventional techniques and patterned as shown in FIG. 2 using an RIE process. Another advantage of present invention is that silicon dioxide layer 33 and the layer of material used to provide control gate structure 34 and gate structure 36 are used to form a portion of both non-volatile memory device 12 and semiconductor device 11. This integration reduces the total number of processing steps required to form integrated circuit 10. This in turn reduces the complexity and cost associated with the manufacture of integrated circuit 10.

Additionally, the use of an oxy-nitride layer to provide the tunneling layer and the formation of a silicon dioxide film using a TEOS deposition process improve the operational performance of non-volatile memory device 12 at elevated temperatures. A semiconductor device formed in accordance with the present invention not only has improved write/erase cycling and data retention capability, but can also be programmed in a shorter amount of time than some previously known structures.

We claim:

1. A semiconductor device comprising:

a substrate;

a first dielectric layer overlying the substrate, wherein the first dielectric layer has a nitrogen composition ranging from about 3 percent to 10 percent by weight;

a floating gate structure overlying the first dielectric layer and having sidewalls;

a second dielectric layer comprising silicon nitride overlying the floating gate structure;

a third dielectric layer comprising silicon dioxide overlying the second dielectric layer, wherein the third dielectric layer has a thickness of at least about 40 angstroms; and a control gate structure overlying the third dielectric layer.

2. The semiconductor device of claim 1 further comprising a fourth dielectric layer comprising silicon dioxide between the floating gate structure and the second dielectric layer.

3. The semiconductor device of claim 1 wherein the first dielectric layer comprises silicon nitride and silicon dioxide.

4. The semiconductor device of claim 1 wherein a portion of the third dielectric layer is overlying the sidewalls of the floating gate structure.

5. The semiconductor device of claim 4 wherein a portion of the second dielectric layer is between the third dielectric layer and the floating gate structure along the sidewalls of the floating gate structure.

6. The semiconductor device of claim 1 wherein the third dielectric layer has a thickness ranging from about 75 angstroms to 225 angstroms.

7. An integrated circuit in a substrate comprising a first semiconductor device and a second semiconductor device, the first semiconductor device comprising:

a first dielectric layer;

a floating gate structure overlying the first dielectric layer;

a second dielectric layer overlying the floating gate structure; and a control gate structure overlying the second dielectric layer; and the second semiconductor device comprising:

a first gate dielectric layer; and a gate structure overlying the substrate, wherein the first gate dielectric layer provides electrical isolation between the gate structure and the substrate, and the first dielectric layer of the second semiconductor device comprises the same material as the second dielectric layer of the first semiconductor device such that the first dielectric layer of the second semiconductor device has substantially the same thickness as the second dielectric layer of the first semiconductor device.

8. The integrated circuit of claim 7 wherein the first semiconductor device further comprises a third dielectric layer between the second dielectric layer and the floating gate structure, the third dielectric layer comprising silicon nitride.

9. The integrated circuit of claim 8 wherein the first semiconductor device further comprises a fourth dielectric layer between the third dielectric layer and the floating gate structure, the fourth dielectric layer comprising silicon dioxide.

10. The integrated circuit of claim 7 wherein the first dielectric layer of the first semiconductor device has a has a nitrogen composition ranging from about 3 percent to 10 percent by weight.

11. The integrated circuit of claim 7 wherein the second dielectric layer of the first semiconductor device has a thickness of at least about 40 angstroms.

12. A semiconductor device comprising:

a first dielectric layer, wherein the first dielectric layer has a has a nitrogen composition ranging from about 3 percent to 10 percent by weight;

a floating gate structure overlying the first dielectric layer;

a second dielectric layer comprising silicon dioxide overlying the floating gate structure;

a third dielectric layer comprising silicon nitride overlying the second dielectric layer; and a fourth dielectric layer comprising silicon dioxide overlying the third dielectric layer.

13. The semiconductor device of claim 12 wherein the fourth dielectric layer has a thickness ranging from about 75 angstroms to 225 angstroms.

* * * * *